United States Patent [19]

Thompson

[11] 4,399,409

[45] Aug. 16, 1983

[54] APPARATUS FOR TESTING THE LINEARITY OF A FREQUENCY MODULATED OSCILLATOR

[75] Inventor: David Thompson, Coquitlam, Canada

[73] Assignee: AEL Microtel, Ltd., Burnaby, Canada

[21] Appl. No.: 239,760

[22] Filed: Mar. 2, 1981

[51] Int. Cl.$^3$ ............................................. G01R 23/15
[52] U.S. Cl. ............................... 324/78 Z; 324/79 D; 331/17; 331/23; 331/44; 332/20
[58] Field of Search ...................... 331/17, 18, 23, 34, 331/44, 172, 173, 177 V; 455/67, 115, 226; 332/18, 20; 324/78 Z, 79 D

[56] References Cited

U.S. PATENT DOCUMENTS 2,678,427 5/1954 Smith ................................ 331/64 X
3,071,726 1/1963 Nelson ............................. 331/44 X Primary Examiner—Siegfried H. Grimm
Assistant Examiner—Tim A. Wiens
Attorney, Agent, or Firm—Leonard R. Cool

[57] ABSTRACT

A linearity test signal generator alternately provides a burst of a modulation frequency and no modulation to the modulation input of the frequency modulator oscillator (FMO) under test. A programmable divider is connected to the output of said frequency modulated oscillator to produce a binary output signal which is applied to the automatic phase control circuit. This circuit in turn develops a DC control signal which is applied to the control input of said frequency modulated oscillator to maintain the average oscillator frequency constant. This DC control voltage gives an indication of the shift in the average free running frequency of the oscillator while being modulated, caused by oscillator non-linearity. The voltage is first sampled when the oscillator is unmodulated to produce a reference voltage which is stored and then compared to a sample of the DC control voltage when the oscillator is being modulated. The difference between the two voltage samples is used to generate an error signal proportional to the amplitude and the sign of the difference. A zero center meter is employed to indicate the magnitude of the error and to permit rapid adjustment to obtain a minimum error indication.

8 Claims, 4 Drawing Figures

APPARATUS FOR TESTING THE LINEARITY OF A FREQUENCY MODULATED OSCILLATOR

BACKGROUND OF INVENTION

This invention relates to techniques for testing of the linearity of frequency modulated oscillators, and more particularly to the use of bursts of modulation in conjunction with monitoring of the oscillator's DC control voltage to simplify the testing procedure. A frequency modulated oscillator is one whose instantaneous frequency follows an external modulating signal, called modulation. If this modulation is a symmetrical waveform and if the frequency modulated oscillator responds in a linear manner to this modulation there will be no net shift of the oscillator's average frequency while being modulated. If, however, the oscillator's response exhibits non-linearity of a certain kind, there will be a net shift in the oscillator's average frequency under modulation. This particular kind of non-linearity also happens to be one that must be carefully controlled and minimized in an FM system.

In many instances an automatic phase control (APC) circuit is used in a feedback loop around a frequency modulated oscillator (FMO) to stabilize the oscillator's frequency, usually by application of a DC correction voltage to the oscillator. If this feedback loop were broken, the oscillator would then oscillate at its free running frequency. If symmetrical modulation is applied to the oscillator and its response is non-linear, its free running frequency will shift. If the APC unit feedback loop is engaged at this time, the DC correction voltage will be adjusted to compensate for this frequency shift, thus giving a different voltage value than when the oscillator was unmodulated.

In many instances, circuitry can be incorporated within the oscillator to correct for its non-linear response to modulation. However, adjustment of this linearity correction circuitry affects the basic tuning of the oscillator, changing its free running frequency also. Thus the DC control voltage to the oscillator will be affected by both the oscillator's non-linearity and the detuning due to the linearity correction adjustment.

The circuitry described herein enables these two effects to be separated in a linearity measurement circuit which allows only the change in control voltage due to FMO non-linearity to be displayed. This is accomplished with circuitry which is intrinsic to the radio transmitter of which the FMO is a part. Previous approaches to this linearity measurement have required complex, specialized, expensive external testing equipment based upon different principles than the ones described above.

SUMMARY OF INVENTION

Apparatus for testing the linearity of a frequency modulated oscillator includes the application of short bursts of a modulation test frequency so as to obtain alternately the carrier alone and the deviated signal at the output of the frequency modulated oscillator; the output frequencies are converted into first and second DC control signal voltages which are derived, respectively, from the carrier signal and the deviated signal. These control signals are sequentially applied to inputs of a comparator which provides at an output an error signal representative of the magnitude and sign of the difference between the amplitudes of the first and second control signals.

DETAILED DESCRIPTION OF PREFERRED EMBODIMENTS

Figure 1:
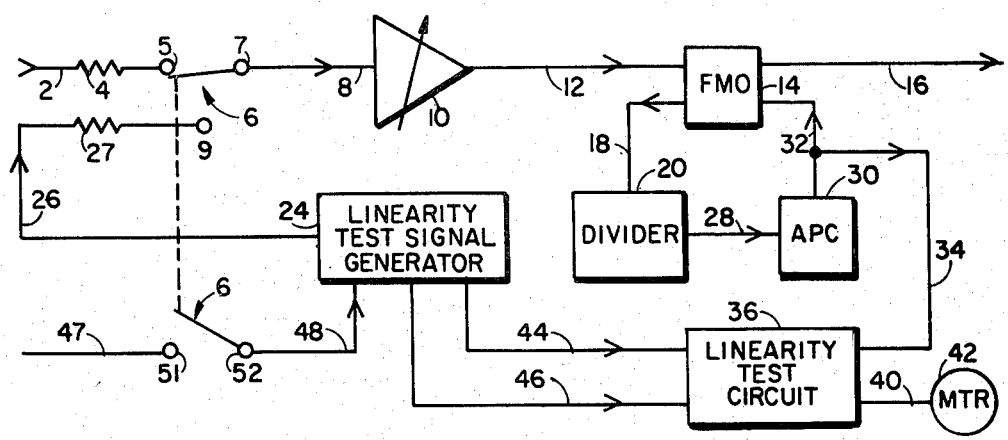
FIG. 1 is a block diagram of the preferred embodiment of the invention and includes the modulation amplifier and the frequency modulated oscillator.

Referring now to FIG. 1, it may be seen that the normal modulation input frequencies to the modulation amplifier 10 and frequency modulated oscillator (FMO) 14 are applied via path 2 bridging resistor 4, multipole switch 6, terminals 5 and 7, and path 8 to the input of the modulation amplifier. When the circuit is under test, multipole switch 6 is turned to the test position which then disconnects amplifier 10 from the normal modulation input and connects the output of linearity test signal generator 24 via path 26 bridging resistor 27, multipole switch 6, terminals 9 and 7, and path 8 to the input of modulation amplifier 10. As will be disclosed in detail hereinafter, generator 24 alternately provides no modulation and a burst of square-wave frequency of predetermined amplitude and at a predetermined rate to the input of modulation amplifier 10 along path 26. Generator 24 also provides synchronization signals along paths 44 and 46 to the linearity test circuit 36 which are used in the measurement sequence. The output signal from the FMO is applied via path 16 to external equipment which is not of concern here. An additional output of the FMO is applied via path 18 to divider 20 which is used to bring the signal frequency within the range of a programmable divider which forms part of the automatic phase control (APC) circuit 30. Path 28 links divider 20 with the APC 30, operation of which will be described in detail hereinafter. The APC circuit divides the output frequency of divider 20 and compares this divided signal with an internally generated reference signal, producing a DC voltage appropriate to maintain the frequencies of these two signals equal, and to minimize the phase difference between them. This voltage is fed through path 32 to FMO 14 to control its frequency and simultaneously along path 34 to linearity test circuit 36. The linearity test circuit utilizes the synchronizing signals from the linearity test signal generator 24 in comparing the FMO control voltages under the two different conditions, i.e., unmodulated and modulated. The output of the comparator in test circuit 36 is a direct current signal which is either positive or negative with respect to a reference voltage and also different therefrom in amplitude.

This direct current output signal is measured on a zero center meter 42 during adjustment of the FMO to determine when the non-linearity is set to a minimum.

Figure 2:
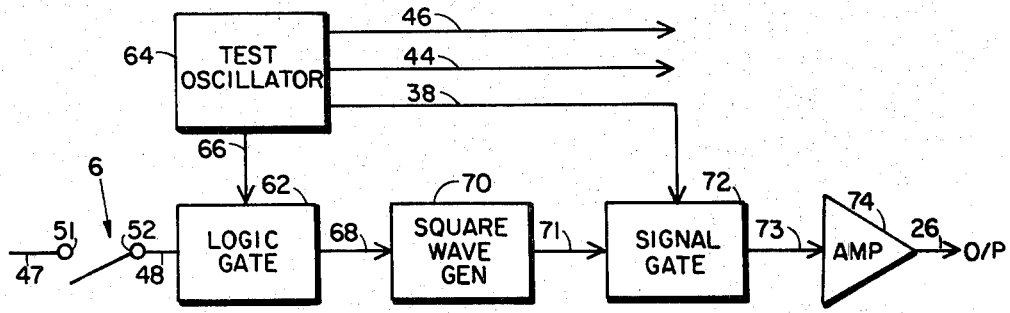
FIG. 2 is a block diagram of the linearity test signal generator.

Referring now to FIG. 2 to may be seen how the linearity test signal generator is configured. Test oscillator 64 produces simultaneously a squarewave which is passed along path 66 to logic gate 62, a lower frequency gating waveform along path 38 to enable or disable signal gate 72, and a pair of synchronization waveforms along paths 44 and 46 to control the linearity test circuit. When the linearity test mode is selected, multipole switch 6 closes allowing an enabling signal (not shown) to pass along path 47 through contacts 51 and 52 and along path 48 into logic gate 62, causing the square waveform on path 66 to be passed through gate 62 and along path 68 into the squarewave generator 70. The squarewave generator produces a squarewave of predetermined amplitude and frequency to cause the FMO to be deviated a known amount for the test. The manner in which the amplitude and frequency are determined is well known and will not be considered here. This squarewave is passed along path 71, and is alternately connected to and disconnected from path 73 by signal gate 72, which is controlled by the low frequency gating waveform on path 38. The gated waveform on path 73 is buffered by amplifier 74 and passes along path 26 to the input of the modulation amplifier when the multipole switch 6 is set to connect contact 7 to contact 9. Thus, periodic bursts of modulation test signal are applied via the modulation amplifier 10 and path 12 to the input of the frequency modulated oscillator 14 so as to obtain alternating outputs from the frequency modulated oscillator of the carrier frequency alone and the deviated test signal. If the oscillator is deviated linearly, it will produce frequency shifts symmetricl about the unmodulated frequency, so making the average free-running frequency of the modulated output equal to that of the unmodulated output.

Figure 3:
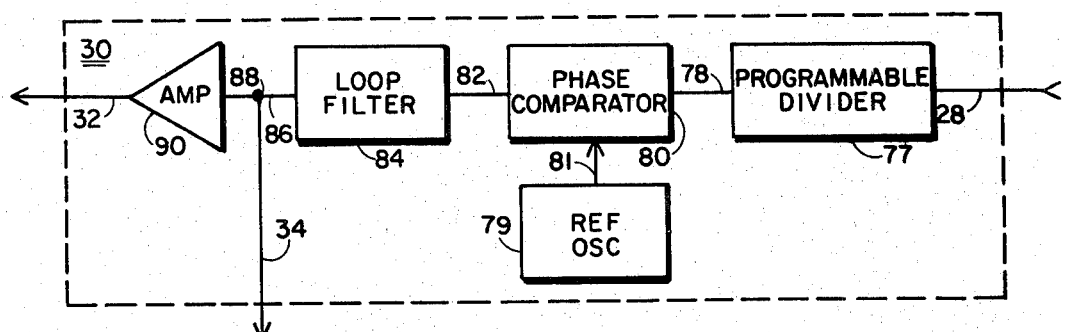
FIG. 3 is a block diagram of the automatic phase control circuit including the reference oscillator.

Referring now to FIG. 3, it may be seen that the output of divider 20 is applied via path 28 to the input of programmable divider 77 which is programmed according to the nominal FMO output frequency to provide at its output a pulse train having a predetermined frequency. This pulse train is passed along path 78 to one input of phase comparator 80 where the phase of the pulse train is compared to that of a pulse train generated by reference oscillator 79 and connected via path 81. The phase comparator applies to path 82 a train of error pulses having a pulse width equal to the phase error between the two pulse trains at the inputs to the comparator (paths 78 and 81). This pulse train is applied to a loop filter 84. This loop filter integrates the error pulses to produce a DC output which is proportional to the deviation in the average free-running frequency of the FMO from its nominal oscillating frequency and which is used to control the FMO. The difference in the FMO control voltages between the unmodulated and the modulated states provides an indication of FMO non-linearity. The direct current output from the loop filter 84 is applied via path 86 to a buffer amplifier 90, and hence via path 32 to FMO 14, as well as via node 88 and path 34 to one input of the linearity test circuit 36.

Figure 4:
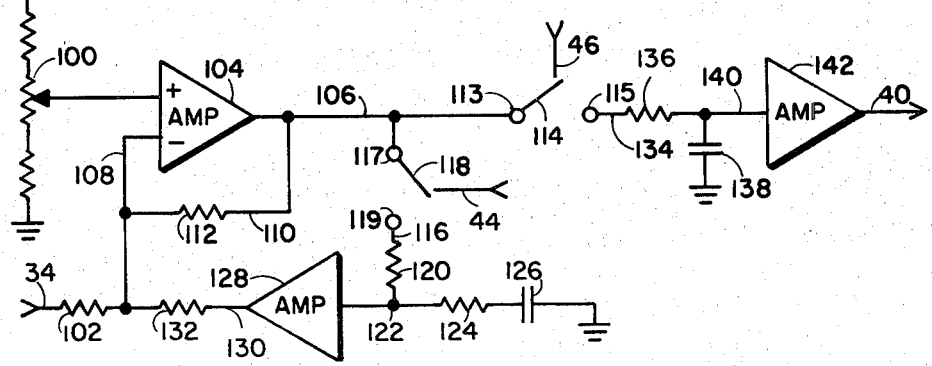
FIG. 4 is a block diagram illustrating the linearity test circuit (36).

Referring now to FIG. 4 the operation of the linearity test circuit 36 will be described, starting at the instant that gate 72 removes the modulation from the FMO. Switches 114 and 118 are both open. The unmodulated FMO control voltage on path 34 is connected through resistor 102 to node 108 at the inverting input of amplifier 104. At a predetermined time during the period in which no modulation is applied to the FMO, the synchronizing waveform on path 44 causes switch 118 to close forming a feedback loop from path 106 at the output of the amplifier 104 through contacts 117 and 119, path 116, resistor 120, node 122, buffer amplifier 128, path 130 and resistor 132 to path 108. The action of this feedback loop is to generate an offset voltage at the output of amplifier 128 which, when summed with the voltage on path 34 and amplified by amplifier 104 through the action of feedback path 110 and resistor 112, will produce a voltage on path 106. This voltage can be adjusted by means of bias trimmer 100 connected to the non-inverting input of amplifier 104, so as to produce a center-scale reading on meter 42, corresponding to zero non-linearity. When the synchronizing signal on path 44 causes switch 118 to open, capacitor 126, connected to node 122 through resistor 124, will store the voltage generated when switch 118 was closed, so maintaining the same offset voltage at the output of the amplifier 128 for the remainder of the measurement cycle. Simultaneously with the opening of switch 118, the modulation is applied to the FMO. At a predetermined time during the period in which modulation is applied to the FMO, the synchronizing waveform on path 46 causes switch 114 to close. The voltage on path 106 now represents the difference between the current voltage on path 34, while the FMO is being modulated, and the voltage previously existing on that path when the FMO was unmodulated. This voltage difference has been amplified and shifted so that a zero difference will produce a center-scale meter reading. This voltage passes from path 106 through contacts 113 and 115, along path 134 through resistor 136 to path 140 at the input of buffer amplifier 142. The action of resistor 136 and capacitor 138 is to filter this signal to remove noise components which would otherwise be passed through amplifier 142 and along path 40 to the meter 42, giving a fluctuating meter reading. When the signal on path 46 causes switch 114 to open, the voltage that was last present at node 106 is stored by capacitor 138 to hold the meter reading until the next measurement is made. Simultaneously with the opening of switch 114, the modulation is removed from the FMO and the sequence just described repeats. With this system in operation, the meter reading corresponding to minimum non-linearity of the FMO remains at center-scale, and is not affected by changes in the FMO control voltage on path 34 caused by detuning of the FMO average free-running frequency, resulting from adjustment of the linearity control on the FMO.

What is claimed is:

1. Apparatus for testing the linearity of a frequency modulated oscillator comprising:

timing means generating first and second synchronizing signals and a first timing signal;

logic means responsive to said first timing signal for applying short bursts of a modulating test signal to the oscillator so as to alternately obtain a carrier alone and a deviated signal at the output of the oscillator;

first means responsive to an output signal of the oscillator for alternately generating a first DC control signal voltage derived from the carrier signal and a second DC control signal derived from the deviated signal;

second means responsive to said first and second synchronizing signals and sequentially responsive to said first and second control signals for providing at an output terminal an error signal representative of the magnitude and sign of the difference between the magnitudes of said first and second control signals; and third means responsive to the error signal at said output terminal of said second means for measuring the magnitude and sign of the error signal so as to determine when the difference has been set to a minimum.

2. Apparatus as set forth in claim 1 wherein said timing means produces a second timing signal and said logic means comprises:
a signal generator responsive to said second timing signal for generating the modulating test signal; and
first gating means responsive to said first timing signal so as to periodically apply the modulatig test signal to the oscillator.

3. Apparatus as set forth in claim 2 wherein said signal generator develops a square wave output signal.

4. Apparatus as set forth in claim 1 wherein said second means comprises:
first storage means;
first gating means responsive to said first synchronizing signal for causing said first storage means to store an amplitude representative of said first DC control signal; and
comparing means comparing the signal on said first storage means and said second DC control signal for providing a DC output signal representative of the magnitude and sign of the difference between the first and second DC control signals.

5. Apparatus according to claim 4 further comprising second gating means responsive to said second synchronizing signal for coupling the DC output signal from said comparing means to said output terminal.

6. Apparatus according to claim 5 wherein said comparing means comprises amplifier means having the first and second DC control signals electrically connected to an input terminal thereof, said first storage means being electrically connected between said input terminal and a reference potential, and said first gating means being electrically connected in a feedback loop around said amplifier means for causing a prescribed voltage which is related to the first DC control voltage to be stored on said first storage means.

7. Apparatus according to claim 6 wherein said second gating means is electrically connected in series with the output line of said amplifier means and said output terminal.

8. Apparatus according to claim 7 comprising second storage means electrically connected between the output terminal side of said second gating means and the reference potential for storing the difference voltage that is generated at the output of said amplifier means when said third gating means is responsive to the second synchronizing signal during receipt of the second DC control signal.

* * * * *